United States Patent

[11] 3,555,358

[72] Inventor Allen G. Gibbs
Oklahoma City, Okla.

[21] Appl. No. 864,647
[22] Filed Oct. 8, 1969
[45] Patented Jan. 12, 1971

[73] Assignee LTV Ling Altec, Inc.
Anaheim, Calif.
a corporation of Delaware

[54] OVERLOAD PROTECTION NETWORK FOR SOLID STATE AMPLIFIER
8 Claims, 4 Drawing Figs.

[52] U.S. Cl. .................................................... 317/16,
317/22, 317/36, 317/38, 330/11, 307/202
[51] Int. Cl. .................................................... H02h 7/20
[50] Field of Search ...................................... 330/51, 11;
307/202, 94, 237; 317/16, 33, 22, 36, 38

[56] References Cited
UNITED STATES PATENTS

| | | | |
|---|---|---|---|
| 3,233,115 | 2/1966 | Chou ............................ | 330/51X |
| 3,500,218 | 3/1970 | Burwen ........................ | 330/11P |

*Primary Examiner*—J. D. Miller
*Assistant Examiner*—Harvey Fendelman
*Attorney*—Harry R. Lubcke

ABSTRACT: A network employing auxiliary transistors to protect a solid state amplifier against short-circuited, reactive or abnormally low values of output impedance. Diodes in the network determine the level threshold for energizing the network. A time-constant circuit provides a time delay threshold to prevent nondamaging transients or momentary shorts from energizing the network. When energized, the network arranges bypassing of current from the output transistors, and for a serious abnormality clamps the input of the whole amplifier to ground. Another time-constant circuit determines how long the input shall be clamped to ground and automatically allows recycling of the protective function.

PATENTED JAN 12 1971 3,555,358

INVENTOR.
ALLEN G. GIBBS
BY Harry R. Lubcke
AGENT

OVERLOAD PROTECTION NETWORK FOR SOLID STATE AMPLIFIER

BACKGROUND OF THE INVENTION

This invention pertains to a protective network for a solid state amplifier that operates when abnormal output load impedance conditions are imposed upon the amplifier.

The need for electrically protecting power transistors against destruction because of circuit abnormalities has been known since shortly after such transistors were developed. Early efforts to provide output overload protection were limited to removing the input signal drive individually for each transistor for a period equal to the duration of the overload. Such circuits were instantaneously responsive and were spuriously actuated by transients and by short circuits of very short duration; said of only 10 milliseconds duration. Such abnormalities are not harmful to the power transistors and such trigger-sharp response of the protection circuit reduced the reliability of the amplifier as an operating device.

Protection against excessive dissipation in the power transistors caused by reactive loads has not been available and may not have been comprehended as a need for protection. Also, certain protective arrangements have required manual resetting.

BRIEF SUMMARY OF THE INVENTION

The method and apparatus of this invention not only limits the current through the output power transistors, but also limits the voltage across them as well. This is doubly effective, particularly with reactive loads, since transistors are damaged by excessive power dissipation as well as by excessive current.

The output current and the voltage across the output power transistors are sensed. If a predetermined maximum current is detected, the current is limited to this value. If, at the same time, a predetermined maximum voltage across the power transistor is exceeded, the input signal is removed from the power amplifier for a predetermined time.

It is not desirable that an amplifier be rendered inoperable by a brief transient, the shock of turning it on, or a momentary abnormally highly inductive load (or capacitative load). Thus, a turn-on time delay for the protective network of the order of one-fiftieth second is provided. This is accomplished by a time constant circuit which must accumulate a charge before inoperability of the amplifier begins.

A turn-on time constant circuit maintains inoperability of the amplifier until this circuit loses its charge. This is a time interval sufficiently long to allow the power transistors to cool off; of the order of a few seconds.

DESCRIPTION OF THE PREFERRED EMBODIMENTS

Figure 1:
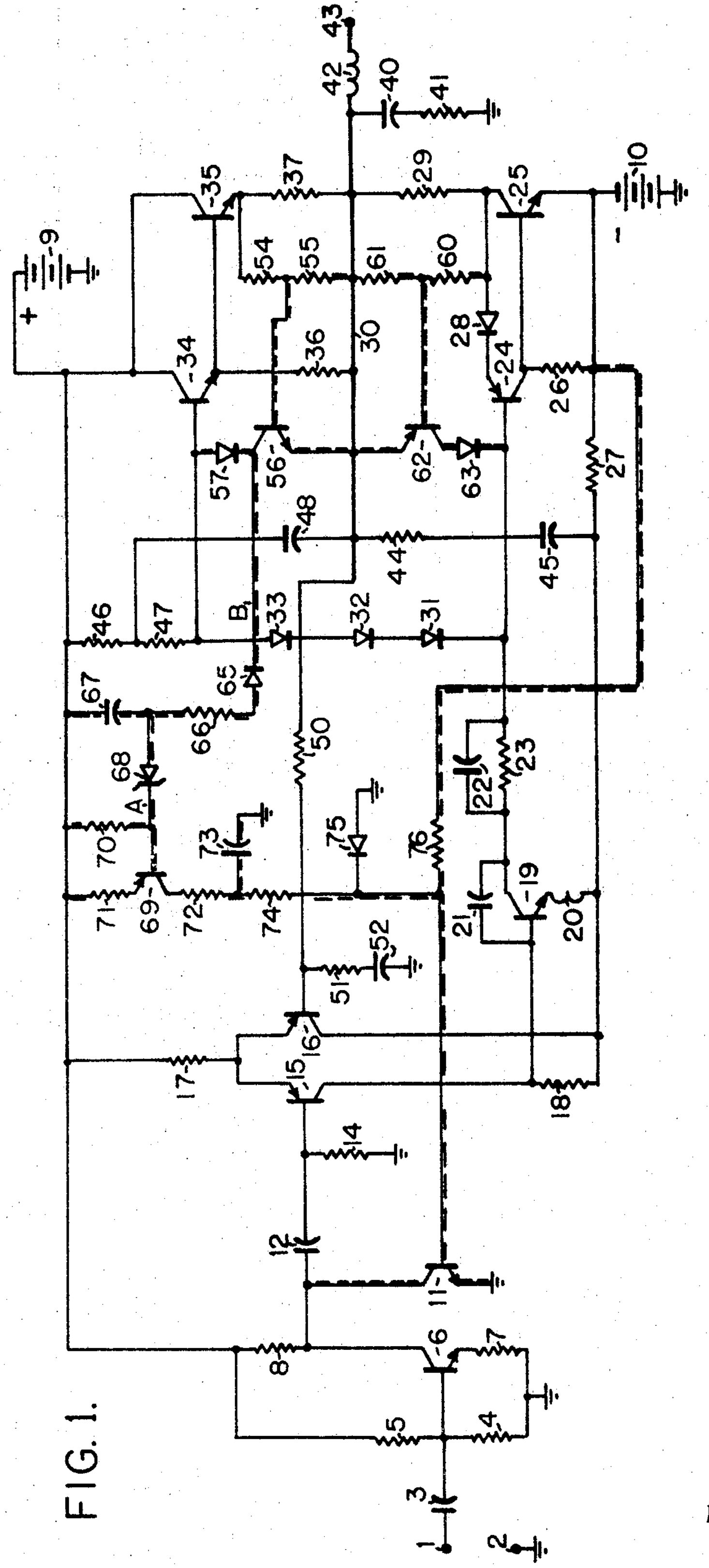
FIG. 1 is a schematic diagram of a typical embodiment of the protective network as applied to a solid state double-ended amplifier.
Figure 2:
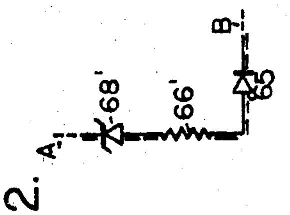
FIG. 2 is a fragmentary schematic diagram of an alternate embodiment thereof, which omits capacitor 67.

In FIGS. 1 and 2 the parts of the circuit that particularly embody the protective network are emphasized by a dotted line in addition to the usual solid line. This does not signify shielding of such connections.

An input signal to be amplified, typically in the audio frequency range, is impressed between terminal 1 and grounded terminal 2. The usual coupling capacitor 3, having a capacitance of the order of 0.2 microfarad (mfd.) is connected to terminal 1 and to the common connection between the two resistors 4 and 5, having resistances of 22,000 and 180,000 ohms, respectively. These resistors suitably bias the base of transistor 6 by series connection between the positive terminal of a voltage source, battery 9, and ground. Transistor 6 may be of the NPN type 2N5133, as may others not otherwise specified herein. The batteries shown in FIG. 1 may be equivalent power supplies, typically having voltages of plus 36 volts with respect to ground for battery 9 and minus 36 volts with respect to ground for battery 10.

The emitter of transistor 6 is connected to ground through resistor 7, of 470 ohms, while the output resistor 8, of 3,300 ohms, is connected between the collector of transistor 6 and the positive terminal of battery 9. Elements 3 through 8 comprise a typical input amplifying stage.

The collector of transistor 6 connects directly to the collector of transistor 11, which latter transistor acts to clamp the output of transistor 6 to ground upon the occurrence of a fault in the power amplifier, about which more will be said later.

The collector of transistor 6 is also connected to coupling capacitor 12, of 0.47 mfd., for obtaining the normal wanted amplifying function. Capacitor 12 also connects to resistor 14, of 10,000 ohms, and the base of transistor 15. The emitters of transistors 15 and 16 are connected together and through a variable resistor 17, of 10,000 ohms, to battery 9 positive terminal. Transistors 15 and 16 are both of the PNP 2N5254 type and comprise an input differential amplifier for the main power amplifier, with negative feedback from the output being impressed upon the base of transistor 16.

Resistor 18, of 680 ohms, is connected to the collector of transistor 15, and also to the negative terminal of battery 10 through resistor 27 of 270 ohms, and positive feedback elements comprised of capacitor 45, of 50 mfd. and resistor 44, of 100 ohms. Continuing the main channel of amplification, this collector is also connected to the base of NPN 2N3053 driver transistor 19, the emitter of which connects to negative battery 10 through Ferrite inductor 20, of b 0.1 millihenries inductance. A ceramic disc capacitor 21, of 100 picofarads capacitance, connects between the base and collector of transistor 19 to reduce the high frequency gain of transistor 19.

The collector of transistor 19 is further connected to a shunt impedance comprised of capacitor 22, of 0.02 mfd. and resistor 23, of 390 ohms, which acts to give a different load impedance to transistor 19 for AC with respect to AC and thereby to change the AC vs. DC gain. The second connection from the shunt impedance connects serially to the first transistor 24, of PNP 2N4037 type, of a complementary pair which also includes transistor 25, of NPN 2N5037 type, (or 2N3055 type). This output configuration is known as quasi-complementary, and is used to avoid the greater cost if transistor 25 was of the PNP type.

The collector of transistor 24 is connected to resistor 26, of 100 ohms, and therethrough to the negative terminal of battery 10. The equivalent energizing connection of transistors 19, 15 and 16, previously described, is accomplished through positive feedback isolation resistor 27, of 270 ohms. The collector of transistor 24 also connects to the base of transistor 25. A connection is made from the collector of transistor 25 back to the emitter of transistor 24 through diode 28, with the cathode connected to the emitter. This is to make transistor 25 appear as a large emitter loaded PNP transistor, forming the quasi-complementary output configuration. The collector of transistor 25 also connects to resistor 29, of a half-ohm resistance, and therethrough to output bus 30.

The driver signal is conveyed to the other side of the double-ended pair of the power amplifier through a plurality of diodes, as 31, 32, 33, all similarly poled to pass signals of negative polarity, and ultimately connecting to the base of transistor 34, of NPN 3053(2N) type. This is the first of a Darlington pair, which also includes transistor 35, of NPN 2N5037 type (or 2N3055 type). All diodes are 1 ampere 100 PIV rating. The emitter of transistor 34 is connected to resistor 36, of 100 ohms, as before, but in this instance the second terminal of the resistor is connected to output bus 30 instead of to battery 10 negative terminals. The collector is connected to positive battery 9 and also to the collector of transistor 35, according to the Darlington configuration. Similarly, the emitter of transistor 34 is connected to the base of transistor 35, The emitter of transistor 35 is connected through resistor 37, of one-half ohm, to output bus 30.

In continuing on to the output load, which has not been shown, output bus 30 is connected to a series circuit to ground consisting of capacitor 40, of 0.022 mfd., and resistor 41, of 20 ohms, which circuit serves to suppress output ringing at frequencies above the audio spectrum. Additionally, inductor 42 is connected in the output conductor, which terminates in output conductor, which terminates in output terminal 43. A typical inductance value is one millihenry. The output terminal may be connected to the primary of a known output transformer, with the second terminal of the primary connected to ground, and with one of more secondaries as desired. A typical load is a loudspeaker connected to a secondary winding.

The collector of transistor 25 is connected to output bus 30, while it is the emitter of transistor 35 that is so connected. This is a quasi-complementary configuration which provides negative-going class B output. Resistor 44 and capacitor 45, previously mentioned, connect from output bus 30 to the away-from-battery terminal of resistor 27 to provide a positive feedback loop for transistors 15, 16 and 19.

Connected between the positive terminal of battery 9 and the base of transistor 34 are two resistors, 46 and 47, in series and both of 3,900 ohms resistance. The center connection between the resistors is connected to capacitor 48, of 50 mfd. This is a positive feedback network for transistor 19, providing current on positive half cycles.

The negative feedback circuit to transistor 16 comprises resistor 50, of 10,000 ohms, connected between the base thereof and output bus 30, with a series circuit to ground also connected to the base comprised of resistor 51, of 560 ohms, and capacitor 52, of 10 mfd. This circuit determines the overall AC and DC gain of the amplifier. The DC gain is less because of the reactance of capacitor 52.

We now turn to the protection circuit. A major part of this originates at voltage divider 54, 55, which is connected across output impedance (resistor) 37. Resistor 54 typically has a resistance of 150 ohms, while resistor 55 is 68 ohms. Thus, approximately one third of the voltage drop across impedance 37 is impressed upon the base of auxiliary transistor 56; the emitter of this NPN transistor being connected to output bus 30 and the collector to the base of transistor 34 of the Darlington pair through diode 57, which diode is poled to pass negative excursions of voltages. In case of excessive current through impedance 37, transistor 56 is forward biased and through diode 57 limits the input signal to transistor 34, thus acting to reduce the excessive output current. In a typical embodiment, any voltage across resistor 55 (which is also across the base-emitter junction of transistor 56) of 0.6 volt or less results in transistor 56 being turned off, while a voltage of 0.7 volt or more results in transistor 56 being driven to saturation conductivity. Besides acting to limit the signal drive at transistor 34, diode 57 also acts to prevent turn-on of transistor 56 in a back-bias avalanche mode on output negative half cycles.

A similar circuit is arranged on the other side of the power amplifier, involving resistors 61 and 60, auxiliary transistor 62 and diode 63. The resistors have the same values, 68 and 150 ohms, respectively, but transistor 62 is a PNP type 2N4248 instead of the NPN 2N5133 type of transistor 56. The polarity of diode 63 is reversed with respect to that of diode 57.

Control energy for the rest of the protection circuit is taken from the collector of transistor 56, and passes first to diode 65, which is poled with the cathode to the collector. This diode decouples audio frequency signals present in the amplifier proper from the protection network. Diode 68 is of the Zener type and in this embodiment has a 12 volt breakdown voltage rating. It is connected with anode to the common connection between resistor 66 and capacitor 67 and establishes an amplitude threshold for conduction by further auxiliary transistors to be described.

Resistor 66, of 10,000 ohms resistance in this embodiment, is connected to the anode of diode 65 and in series with capacitor 67, of 50 mfd., to positive battery 9. This resistance-capacitance combination provides turn-on delay of the order of one-fiftieth second, to prevent transients from actuating the protection network.

The cathode of Zener diode 68 is connected to the base of PNP 2N4356 transistor 69, and also to resistor 70, of 1,800 ohms, which in turn is connected to positive battery 9, providing bias for auxiliary transistor 69. The emitter of transistor 69 is connected to positive battery 9 through resistor 71, of 100 ohms, while resistor 72, of 270 ohms, is connected to the collector of transistor 69 to limit the current through it. The second terminal of resistor 72 is connected to capacitor 73, of 125 mfd., the second terminal of which is connected to ground, and also to resistor 74, of 12,000 ohms. Capacitor 73 and resistor 74 form a turn-off time constant delay circuit that typically holds the protection network in the protection mode for a period of the order of 3 seconds, once it has been energized.

The second terminal of resistor 74 is also connected to the base of clamping transistor 11, to place that transistor in the conductive saturation state when the protection network is fully activated and thereby to shunt the incoming signal to be amplified to ground. The base is given bias by resistor 76, of 4.7 megohms resistance, the second terminal of which is connected to negative battery 10. Diode 75 is also connected to the base of transistor 11, with the anode thereof connected to ground. Resistor 76 and diode 75 set the bias voltage of transistor 11 at minus 0.6 volt when the protection function is off.

In addition to the aspects of operation given above, further aspects are considered below.

Figure 3:
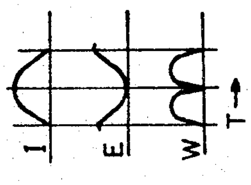
FIG. 3 shows output waveforms for a resistive load.

FIG. 3 shows the relation between output current I, output voltage E across transistor 35, and the power dissipation in the transistor W, as a function of time T, for a resistive load at output terminal 43. Positive values are upward on the graph. The situation is equivalent for transistor 25. It is to be noted in this FIG. that the dissipation is of relatively low amplitude and that it consists of a double frequency excursion with respect to the excursions of current and voltage. In typical embodiments the dissipation per transistor is of the order of 11 percent; 11 watts for a 100 watt output amplifier.

Figure 4:
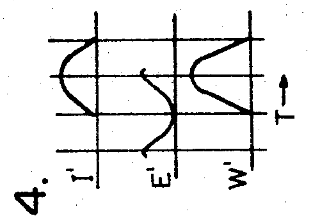
FIG. 4 shows output waveforms for an inductive load.

FIG. 4 gives the same parameters for a purely inductive load. Current I' ags voltage E' by 90 electrical degrees. The mathematical multiplication of voltage and current to give wattage is now much different than for the resistive load. Voltage and current are now at maximum values in the output transistor and so the wattage W' increases to much greater amplitude than before. The dissipation reaches 50 percent per transistor; 50 watts each for a 100 watt output amplifier.

The inductive load condition is one that must be protected against. In addition to the excessive current through the output transistors because of an accidental short across the output, or if the impedance of the load decreases to a fraction if its intended value, the excessive wattage dissipation in the output transistors requires protective action, and such action is given in the method and apparatus of this invention.

The inductive load condition can be brought about in otherwise normal use of the amplifier, when a loudspeaker is the load. The loudspeaker becomes an inductive load at certain audio frequencies, depending upon its construction, and quite inductive at its resonant frequency. It is not necessary to embody this invention for a purely inductive load, since such a load is seldom met in practice. An embodiment suited to accept a load of reasonable inductivity is competitively possible in the sound amplification field. Such an embodiment will also handle capacitive loads of an equivalent degree, should such be encountered.

With the protective network of this invention, if an overcurrent situation develops in the output circuit with a resistive load, only output current limiting takes place. For a reactive load and an overcurrent situation, or a short circuit of the output, the amplifier shuts off for a "cooling off" period, say of three seconds, during which time the heat generated in the vital junction of the transistor has time to be conducted away to the surrounding structure.

Current limiting takes place according to this invention when the voltage built up across the output circuit because of excessive current flow, as across resistor 37, is sufficient to cause transistor 56 to conduct. The collector of transistor 56 then draws current through diode 57 from the base of transistor 34. Limiting this current limits the output current flowing through transistor 35 and resistor 37.

This current limiting is manifested in FIG. 3 by the I (current) waveform having a flat top rather than the usual rounded top shown.

The same situation obtains on negative half cycles by the functioning of transistor 62 in the same manner.

As to the wattage dissipation if the power transistors because of overvoltage across them (usually accompanied by excessive current as well), the voltage across such a transistor as 35, is the voltage of battery 9 less any voltage developed across the load at terminal 43. In the protection mode, transistor 56 is conducting. There is a path from the positive terminal of battery 9 to output terminal 43 through resistor 70, Zener diode 68, resistor 66 and diode 65 through transistor 56 to output bus 30. When the voltage drop across resistor 70 becomes great enough to cause transistor 69 to conduct, then a condition of overvoltage exists and the input signal clamping to ground process takes place at transistor 11.

The component values given herein are such that normal operation with a resistive or a reasonable reactive load occurs. However, for overcurrent of overvoltage conditions at the output transistors these component values cause the protection network to function.

The general mechanism of current limiting has been given above. The general mechanism of signal clamping will now be given.

For either a shorted output at termal 43, a very low impedance load there, or for a reactive load that produces a voltage drop across the output transistors 25 and 35 greater than a predetermined safe amplitude in the presence of the current limiting function, the protection network function to clamp the input signal to ground. The voltage drop across the output transistors then reduces to a safe value. In this protection mode the functioning of the several circuit elements involved, as 56, 65, 66, 68, 70, 69 and 11, has been given above.

Further, as to the length of time that the amplifier is inoperative because of the clamping to ground action, when transistor 69 is forward biased and is conducting, current flows from battery 9, through resistor 71, transistor 69 and resistor 72 to capacitor 73, charging this capacitor.

When capacitor 73 has charged enough positively to increase the voltage on the base of transistor 11 to 0.7 volt positive, this transitor performs its clamping function. The loss of this signal causes transistors 59 and 69 to cease conducting, but the signal channel remains clamped at transistor 11 until the charge on capacitor 73 is discharged through resistor 74. It is this time constant that determines the 3 second off period, and by varying the values of elements 73 and 74 it is seen that any period of inoperability of the amplifier may be obtained.

Considering subsidiary aspects of the protection network, resistor 66 limits the current through Zener diode 68. Resistor 70 is selected in resistance value to cause transistor 69 to conduct under conditions of overload. The resistance values of resistors 71 and 72 limit the current through transistor 69 and the rate of charge of capacitor 73 (which is much faster than its typical 3second discharge). Besides determining the rate of discharge of capacitor 73, resistor 74 also determines that transistor 69 will be reverse biased during normal operation of the amplifier as a whole.

Resistor 66 and capacitor 67 determine the turn-on time constant for diode 68 and consequently for the initiation of the protection process. This time delay prevents brief transients or short circuits of short duration from shutting off the amplifier as a whole, as has been stated. Capacitor 67 has a charged status when transistor 56 conducts because of an abnormal output condition.

Since manual operation is not required in the functioning of the protection network of this invention it will be seen that in the presence of a relatively permanent abnormal output condition the protection network will automatically recycle. After the conclusion of a 3 second off cycle a one-fiftieth second on cycle will occur. If the abnormality is still present another 3 second off cycle will take place after the one-fiftieth second, and so on. Such short periods of operation will not damage the output amplifier and should the abnormality be removed for any reason the amplifier will operate normally within 3 seconds of the time of such removal without manual intervention.

It is possible to practice this invention without employing the turn-on delay period. The changes in the protection network required to accomplish this are set forth in FIG. 2. This FIG. gives that part of the network between letters A and B in FIG. 1. In the modified circuit capacitor 67 is omitted. The rating of Zener diode 68' has a higher value than that of prior diode 68, being 18 volts breakdown rather than 12, in typical embodiments. The value of resistor 66' is less than that of prior resistor 66, being 4,700 ohms instead of 10,000ohms. Diode 65 remains the same.

Because of the absence of capacitor 67, the time constant functioning is also absent. The other changes of FIG. 2 are made to give satisfactory operation of the protective network in the absence of the capacitor.

While the amplifier of FIG. 1, typically of high fidelity audio frequency, class AB or B type, giving 60 watts RMS power output with 60 db power gain and 26 voltage gain without an output transformer, has been fully disclosed herein to supply full knowledge of the interface between the protective network and the amplifier, it will be understood that other types of amplifiers and those of different power output and different gain may be similarly protected by the network according to this invention.

I claim:

1. The method of protecting a transistorized power amplifier having an input stage, which includes the steps of:

a. sensing the current in the output impedance of said amplifier, to produce an electrical variation signifying an abnormally low value of said output impedance;
b. reducing the current flowing through said output impedance below that flowing at the time of occurrence of said electrical variation by reducing the signal input to said power amplifier;
c. interposing a time delay upon said electrical variation;
d. clamping said input stage to ground upon the occurrence of the delayed said electrical variation;
e. retaining the clamp upon said input stage beyond the time of cessation of the delayed said electrical variation; and
f. automatically returning the amplifier to operation after the period of clamping said input stage to ground.

2. The method of claim 1, which includes the additional steps of:

a. sensing the output voltage of said amplifier; and
b. adding this component to that of sensing the current in the output impedance of said amplifier to produce an enhanced said electrical variation, thereby to protect said power amplifier from abnormal dissipation due to a reactive load upon the output impedance of said amplifier.

3. An abnormal output impedance protective network for a transistorized double-ended amplifier, having an input stage comprising:

a. first and second auxiliary transistors 56,62 connected across first 37 and second 29 output impedances, respectively, of said double-ended amplifier, to sense excessive output current, and further connected to said double-ended amplifier to correspondingly limit the input signal drive to said double-ended amplifier;
b. a first diode 68 connected to said first auxiliary transistor, to establish an amplitude threshold for conduction by subsequent auxiliary transistors;

c. a third auxiliary transistor 69 connected to said first diode;

d. a first time-constant circuit 73,74 connected to said third auxiliary transistor, and e. a fourth auxiliary transistor 11 connected to said input amplifying stage and to said first time constant circuit to clamp the input of the amplifier to ground for a predetermined period determined by the timer constant of said first time constant circuit, when the amplitude threshold of said first diode is exceeded because of an abnormality in said output impedance.

4. The network of claim 3, in which each of the connections of the first and second auxiliary transistors 56,62 across the first and second output impedances 37,29, respectively, also includes:

a. a voltage divider 54,55 connected across each said output impedance 37 and connected to the corresponding auxiliary transistor 56, and the further connection to said double-ended amplifier includes; and b. a second diode 57 connected to said double-ended amplifier and to a said corresponding auxiliary transistor 56, to limit the signal drive to said transistorized double-ended amplifier.

5. The network of claim 3, in which the connection of said first diode 68 also includes:

a. a limiting resistor 66, to limit the current through said first diode; and b. a third diode 65 connected in series with said resistor, to decouple the signal amplified by said amplifier from the protective network.

6. The network of claim 3, in which:

a. said double-ended transistorized amplifier includes a power transistor connected to each of said first and second output impedances;

b. said first diode 68 is a Zener diode; and c. the breakdown voltage of said Zener diode is selected to breakdown when excessive voltage of said Zener exist across each said power transistor in the presence of a degree of said excessive output current.

7. The network of claim 3, in which the connection of said fourth auxiliary transistor 11 includes:

a. a bias resistor 76 connected to said first time constant circuit 73,74 and to a voltage source 10; and b. a connection from the common connection between said bias resistor and said first time constant circuit to the base of said fourth auxiliary transistor 11, to establish the clamping protection level for conduction by said fourth auxiliary transistor.

8. The network of claim 3, which additionally includes:

a. a second capacitor 67 connected to said first diode 68, and to a limiting resistor 66 to form a turn-on time constant circuit to delay the start of clamping by said protective network.